United States Patent
Jeong et al.

(10) Patent No.: US 6,705,245 B1
(45) Date of Patent: Mar. 16, 2004

(54) APPARATUS FOR FORMING POLYMER CONTINUOUSLY ON THE SURFACE OF METAL BY DC PLASMA POLYMERIZATION

(75) Inventors: Young-Man Jeong, Kimhae (KR); Su-Won Lee, Changwon (KR); Dong-Sik Youn, Changwon (KR)

(73) Assignee: LG Electronics Inc. (KR)

( * ) Notice: Subject to any disclaimer, the term of this patent is extended or adjusted under 35 U.S.C. 154(b) by 0 days.

(21) Appl. No.: 09/642,537

(22) Filed: Aug. 18, 2000

(30) Foreign Application Priority Data

Aug. 21, 1999 (KR) ......................... 1999-34781

(51) Int. Cl.[7] .................. C23C 16/507; H01L 21/3065
(52) U.S. Cl. ................ 118/723 E; 118/723 R; 118/719; 118/715; 156/345.43; 156/345.44; 156/345.31
(58) Field of Search ................. 204/165, 164, 204/192.29, 192.36; 422/186.05; 315/111.21; 361/213; 156/345; 216/67; 118/723 E, 718, 719, 715, 723 MP, 723 MW; 442/301; 219/121.52, 121.59; 427/533

(56) References Cited

U.S. PATENT DOCUMENTS

| | | | | |
|---|---|---|---|---|
| 3,777,164 A | * | 12/1973 | Osam | 422/186.05 |
| 4,028,551 A | * | 6/1977 | Thompson | 422/186.05 |
| 4,064,030 A | * | 12/1977 | Nakai et al. | 204/192.36 |
| 4,507,539 A | * | 3/1985 | Sando et al. | 219/121.59 |
| 4,728,406 A | * | 3/1988 | Banerjee et al. | 204/192.29 |
| 4,803,332 A | * | 2/1989 | Koyama et al. | 219/121.52 |
| 5,288,541 A | * | 2/1994 | Blackwell et al. | 428/901 |
| 5,324,552 A | * | 6/1994 | Opower et al. | 427/533 |
| 5,403,453 A | * | 4/1995 | Roth et al. | 204/164 |
| 5,411,592 A | * | 5/1995 | Ovshinsky et al. | 118/718 |
| 5,456,972 A | * | 10/1995 | Roth et al. | 442/301 |
| 5,686,050 A | * | 11/1997 | Wadsworth et al. | 422/186.05 |
| 6,054,024 A | * | 4/2000 | Toyama et al. | 204/192.29 |

FOREIGN PATENT DOCUMENTS

| | | |
|---|---|---|
| JP | 08022960 | 1/1996 |
| JP | 09246259 | 9/1997 |

* cited by examiner

Primary Examiner—Jeffrie R. Lund
Assistant Examiner—Rudy Zervigon
(74) Attorney, Agent, or Firm—Ostrolenk, Faber, Gerb & Soffen, LLP

(57) ABSTRACT

The present invention relates to an apparatus for forming polymer by DC plasma polymerization wherein a substrate is used as an electrode by applying a power to the substrate and an opposite electrode in a deposition chamber is positioned to both the surfaces of the substrate to be deposited. In addition, the present invention can acquire safety during the polymerization by insulating a main body from a substrate to which voltage is applied.

4 Claims, 5 Drawing Sheets

APPARATUS FOR FORMING POLYMER CONTINUOUSLY ON THE SURFACE OF METAL BY DC PLASMA POLYMERIZATION

BACKGROUND OF THE INVENTION

1. Field of the Invention

The present invention relates to an apparatus for forming polymer continuously by DC plasma polymerization, and more particularly, to an apparatus used for the treatment of the surface of metal for thereby maximizing the utilization of a substrate by modifying the surface of the substrate or forming a new film material.

2. Description of the Background Art

Generally, when the surface of a substrate such as a metal plate is treated by plasma discharge, a coating layer having excellent hardness, abrasion resistance, etc. is formed. A product having the coating layer is used as a magnetic disk, optical disk, carbide tool, and the like. In addition, when a paint-coated film formed on the surface of a steel plate is plasma polymerized, the steel plate becomes hardened and has excellent durability and corrosion resistance.

Meanwhile, when it is made possible to continuously form polymer by plasma polymerization, the productivity of the polymerized product is improved. With regard to insulating materials including resin, fabric cloth, nonwaven fabric, etc. of a band-type substrate, it is relatively easy to continuously form polymer by plasma polymerization, and a number of apparatuses has already been proposed. (Japanese Patent 58-120859, 61-21105, and 2-103206).

However, in the case that the band-type metal used as the substrate is plasma polymerized by high frequency discharge while keeping it at an ungrounded potential, there is a problem in forming polymer continuously. The reason thereof is that since metal materials have conductivity, a discharge voltage is applied not only to an electrode, but also to the metallic substrate and metallic parts contacting the substrate. Thus, in the case that a metallic substrate is plasma polymerized by high frequency discharge while keeping it at an ungrounded potential, abnormal discharge occurs due to the conductivity of the metal and thus the apparatus is contaminated. In addition, the coated layer on the polymerized surface of the metallic substrate is apt to be powderized, or peeled off due to unstable discharge, resulting in degeneration of the coated layer and degradation of the product.

On the other hand, it is also possible to continuously form polymer by plasma polymerization while keeping a grounded potential. That is, the band-type metal material is plasma polymerized while keeping it at the grounded potential and continuously transporting the same. However, in the case that the grounded potential is kept, it is difficult to acquire deposition characteristics such as abrasion resistance which can be acquired in case of the ungrounded potential with respect to the plasma-polymerized substrate In Japanese Laid-open Patent Hei 6-136506, an apparatus for forming polymer by plasma polymerization is disclosed. In the apparatus, a band-type substrate can be plasma polymerized by suppressing abnormal discharge and unstable discharge while keeping the above-mentioned ungrounded potential is disclosed. This apparatus makes it possible to generate plasma discharge under a predetermined pressure atmosphere and thus apply a discharge voltage only to electrode.

The apparatus comprises: a transport chamber 10 wherein a set of a unwinding roll 11 and a winding roll 12, a pair of tension rolls 13 and 14, and a support opening 15 are allocated; a deposition chamber 20 wherein deposition is performed on a substrate; a roll-shaped electrode 21 and an opposed electrode 22 allocated opposite to the roll-shaped electrode; an insulating shielding plate 30 prepared between the transport chamber and the deposition chamber; two differential openings 31 and 32 formed on the shielding plate for maintaining the pressure difference between the transport chamber and the deposition chamber; vacuum pumps 17 and 18 for controlling the pressure atmosphere of the transport chamber and deposition chamber; a gas injection opening 23 for injecting raw material gas into the deposition chamber; and exhaust openings 16 and 24 connected to the transport chamber and deposition chamber.

A substrate 1 to be plasma polymerized is transported from the unwinding roll 11 in the transport chamber 10, and is introduced into the deposition chamber 20 via the differential opening 31 at one side. Then, it is transported to the roll-shaped electrode 21, is passed through the vicinity of the opposed electrode 22, and thereafter is transported to the winding roll 12 in the transport chamber 10 via the differential opening 32 at the other side. In the above-described apparatus, in a process where the band-type substrate transported from the transport chamber to the deposition chamber is plasma polymerized by high frequency discharge and is send back to the transport chamber, the atmosphere of the deposition chamber is a glow discharge atmosphere, and the atmosphere of the transport chamber is a non-glow discharge atmosphere, which is lower than that of the deposition chamber.

Plasma discharge has a tendency to be generated under a predetermined pressure atmosphere according to the type of the discharge. For example, plasma polymerization is apt to be generated under a pressure atmosphere of $10^3$~10 torr in general. Beyond this range, it is difficult to generate a glow discharge. Thus, even in the case that a band-type conductive metal material is polymerized, it is preferred that the transport chamber area and the deposition chamber are divided from each other, each of the areas is, maintained at a different pressure atmosphere by the differential opening, the deposition chamber is under the pressure atmosphere of $10^3$~10 torr, and the transport chamber is under a pressure atmosphere beyond the above range, whereby, a glow discharge is generated in the deposition chamber while it is difficult to generate a glow discharge in the transport chamber, thus suppressing abnormal discharge.

Therefore, it is said that discharge is achieved not in the entire substrate, but in the deposition chamber alone by differentiating the pressure atmosphere of the chambers from each other as described above, whereby unpredictable discharge of metal materials excepting electrode portions is prevented with respect to the band-type metal substrate maintained at the ungrounded potential, thus forming a coating layer of a good film material.

However, in the apparatus, in a roll-shaped electrode as a discharge electrode and a curved opposite electrode as an opposite electrode are installed in the deposition chamber wherein plasma reaction occurs by high frequency discharge, and one surface of the substrate to be deposited is contacted by the roll electrode. In this case, of both surfaces of the substrate between the roll electrode and the opposite electrode wherein plasma reaction is actively occurred, deposition occurs only on the surface opposed to the opposite electrode, so there is an inconvenience of performing plasma treatment once more in order to deposit the other surface.

In addition, in the apparatus for forming polymer by plasma polymerization according to the conventional art, since discharge is achieved using high frequency power, (+), (−) power sources are alternatively applied to the substrate used as an electrode. At this time, in the case that the substrate is under the glow discharge atmosphere in case of (−), discharge tends to occur in the entire parts of the substrate irrespective of the position of the opposite electrode. The reason thereof is that discharge begins at the time when electrons are emitted from portions of a low potential.

In addition, in the apparatus for forming polymer by plasma polymerization according to the conventional art, in order that discharge is occurred only at a portion at which the opposite electrode is positioned, a differential opening is formed between the transport chamber and the deposition chamber, and the atmosphere of the transport chamber and the deposition chamber, are differentiated from each other, that is, the transport chamber is made to be under the ungrounded discharge atmosphere. In this case, a device for closing the gap between the chambers has to be added in order to prevent discharge from occurring on the entire substrate, and an additional vacuum pump is required in order to make each of the chambers vacuous by a set pressure. As a result, the number of parts to be put into installation is increased, thus causing the unit price of the apparatus higher.

Further, the electrodes in the deposition chamber has a predetermined area. In this case, carbonization of reaction gas occurs on the circumferential portions of the area of the electrodes, whereby deposition is non-uniformity formed to thus lower the uniformity of a plasma polymerized product.

SUMMARY OF THE INVENTION

In order to solve the above problems and efficiently obtain a good quality plasma polymerized film, an apparatus for forming polymer by plasma polymerization is provided. An object of the present invention is to acquire safety during the polymerization by insulating a main body from a substrate to which voltage is applied.

Another object of the present invention is to provide an apparatus for forming polymer continuously by DC plasma polymerization which makes it possible to deposit a high quality film by making discharge occur only in an opposite electrode portion without closing the gap between chambers by a differential opening, and which makes both surfaces of the substrate to be plasma polymerized at a time under the same conditions.

To achieve the above objects, there is provided an apparatus for forming polymer continuously by DC plasma polymerization according to the present invention, comprising: a transport chamber having an unwinding roll for unwinding a substrate to be surface treated and transporting the same to another chamber and a winding roll for winding the surface treated substrate; a deposition chamber for plasma polymerizing the surface of a substrate by DC discharge plasma by using the substrate as an electrode and installing an additional opposite electrode opposed to the substrate; a high voltage supply unit electrically connected to the substrate for applying a high voltage to the substrate; an insulating unit for electrically insulating an electrical path between the high voltage supply unit and the substrate from the main body of the apparatus; a pumping unit for maintaining a vacuum level of the deposition chamber; and a gas supply unit for introducing reactive gas and unreactive gas into the deposition chamber.

The substrate in the deposition chamber acts as an electrode, that is, an anode or cathode, by applying power to it. In the preferred embodiment, power is applied in such a manner that the substrate becomes the anode and the opposite electrode becomes the cathode.

The transport chamber can includes a unwinding chamber having a unwinding roll for unwinding the substrate to be surface-treated and transporting the same to the other chamber; and a winding chamber having a winding roll for winding the surface-treated substrate.

Between the transport chamber and the deposition chamber, an opening through which the substrate to be surface-treated or the surface-treated substrate can be freely moved is formed.

In the present invention, the power applied by the high voltage supply unit is applied to the substrate. Preferably, the substrate is used as an electrode by applying power to the unwinding roll or winding roll. In this case, an insulating member can be further included between the unwinding roll or winding roll and the chamber at a portion wherein the unwinding roll or winding roll is supported in the chamber. In addition, the substrate contacting the idle roller can be an electrode by applying power to the idle roller in the transport chamber.

In addition, in the apparatus according to the present invention, a plurality of electrodes can be installed at both upper and lower sides of the substrate in the deposition chamber, along the transporting direction of the substrate to be surface treated.

Further, the unreactive gas is introduced between the deposition chamber and the winding roll, and a post-processing chamber for performing after-polymerization on a polymerized substrate can be further included.

Additional advantages, objects and features of the invention will become more apparent from the description which follows.

BRIEF DESCRIPTION OF THE DRAWINGS

The present invention will become better understood with reference to the accompanying drawings that are given only by way of illustration and thus are not limitative of the present invention, wherein.

DETAILED DESCRIPTION OF THE PREFERRED EMBODIMENTS

Hereinafter, the preferred embodiments of the present invention will now be described in detail with reference to the accompanying drawings.

Figure 1:
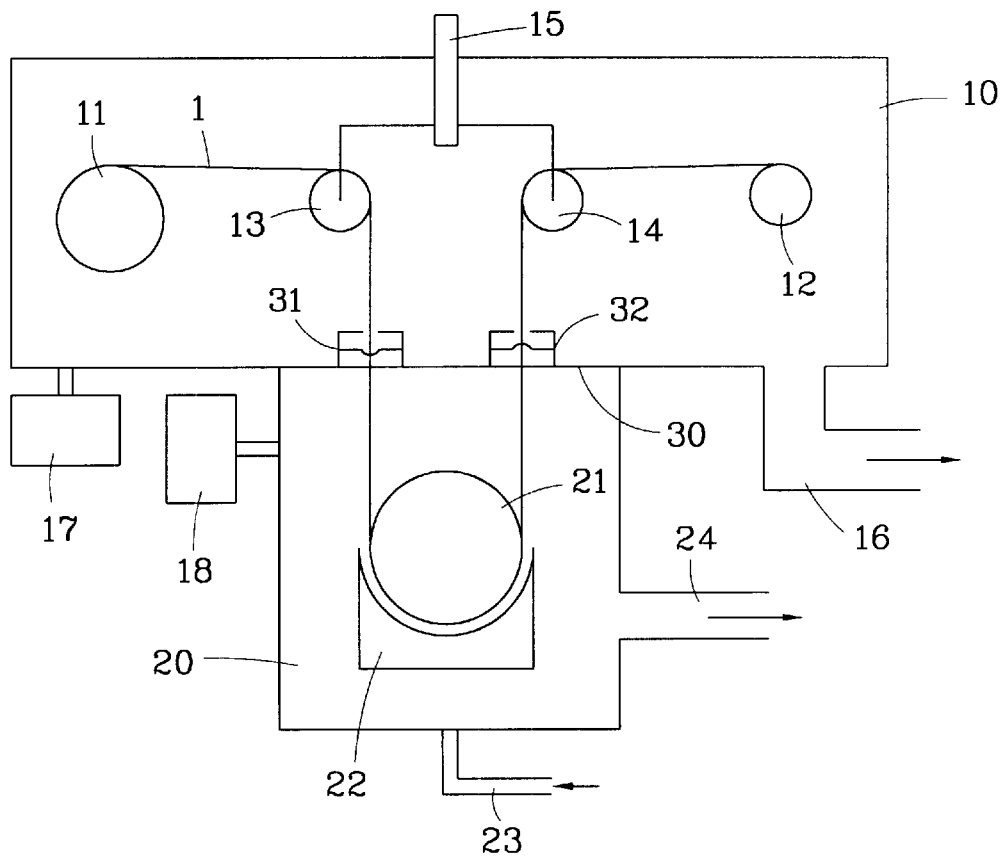
FIG. 1 is cross-sectional schematic view showing an apparatus for forming polymer continuously by plasma polymerization according to the prior art.
Figure 2:
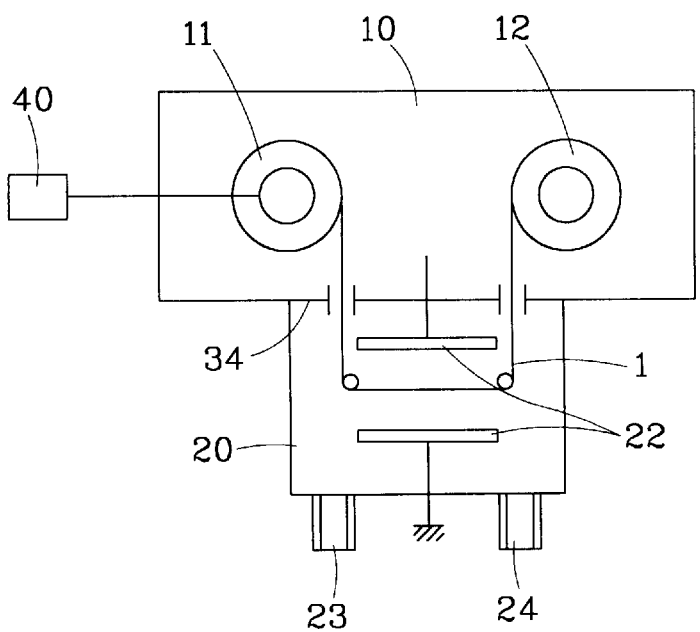
FIG. 2 is a cross-sectional schematic view showing an apparatus for forming polymer continuously by DC plasma polymerization according to a first embodiment of the present invention.

FIG. 2 illustrates an apparatus for forming polymer continuously by DC plasma polymerization according to a first embodiment of the present invention. The apparatus includes: an unwinding roll 11 for unwinding a substrate 11 and transporting the same to a deposition chamber; a winding roll 12 for winding a polymerized substrate; a deposition chamber 20 wherein the substrate is polymerized; an electrode 22 installed in the deposition chamber; a chamber wall 34 installed between the transport chamber and the deposition chamber; an opening 33 installed on the chamber wall and through which the substrate can be freely moved; a vacuum pump (not shown) fore controlling the pressure of the deposition chamber; a gas injection opening 23 for injecting gas into the deposition chamber; and an exhaust opening 24 connected to the deposition chamber. The substrate 1 to be polymerized is used as an anode by applying a DC power 40 to the unwinding roll 11, and the opposite electrode as a cathode in the deposition chamber is positioned to both surfaces of the substrate to be deposited.

The DC power 40 is applied to the unwinding roll 11 and then a band-type substrate 1 wound to the roll 11 is transported to the deposition chamber 20 with the DC power being applied thereto. Next, in the deposition chamber into which reactive gas is injected, plasma occurs between the substrate and the opposite electrode 22, thereby depositing a film on the surface of the substrate.

Since the substrate 1 is used as the anode, and the corresponding cathode 22 is positioned only in the deposition chamber 20, a discharging area is restricted within the deposition chamber. Therefore, there is no need to install an additional vacuum pump in order to close the gap between the transport chamber 10 and the deposition chamber 20 or make the chambers to be under a different pressure from each other.

In addition, since the cathode 22 is positioned to both surfaces of the substrate in the deposition chamber, discharge is occurred on both surfaces of the substrate in the same manner, and accordingly both surfaces can be plasma polymerized at the same time.

Meanwhile, the chamber wall is installed between the transport chamber 10 and the deposition chamber 20, and the opening for freely moving the substrate is installed on the chamber wall. The chamber wall effectively prevents contaminants (e.g., carbonized reactive gas) generated in the deposition chamber from being diffused to the transport chamber to contaminate the substrate, and at the same time makes the substrate to be smoothly moved between the chambers.

Figure 3:
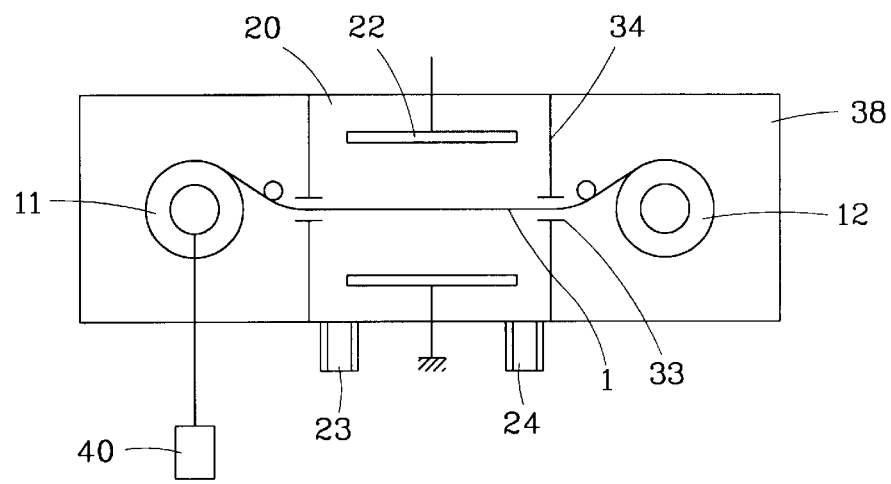
FIG. 3 is a cross-sectional schematic view showing an apparatus for forming polymer continuously by DC plasma polymerization according to a second embodiment of the present invention.

FIG. 3 illustrates an apparatus according to a second embodiment of the present invention. The apparatus comprises: an unwinding chamber 36 having an unwinding roll 11 for unwinding the substrate 1 and transporting the same to the deposition chamber 20; a deposition chamber 20 wherein the substrate 1 transported from the unwinding roll 11 is polymerized; a winding chamber 38 having a winding roll 12 for winding the substrate polymerized in the deposition chamber 20; a cathode electrode 22 installed in the deposition chamber; a chamber wall 34 installed between the unwinding chamber 36 and the deposition chamber 20 and between the deposition chamber 20 and the winding chamber 38, respectively; an opening 33 installed on the chamber wall and through which the substrate can be freely moved; a vacuum pump (not shown) for controlling the pressure of the deposition chamber; a gas injection opening 23 for injecting gas into the deposition chamber; and an exhaust opening 24 connected to the deposition chamber.

In this embodiment, the apparatus is constructed in the same manner as the apparatus as shown in FIG. 2 in that a DC power 40 is applied to the unwinding roll 11, and the cathode 22 is positioned to both the surfaces of the substrate 1 used as an anode by applying a power.

However, the apparatus is different from the apparatus as shown in FIG. 2 in that the unwinding roll 11 is located in the unwinding chamber, the winding roll 12 is located in the winding chamber 38, the unwinding chamber, deposition chamber, and winding chamber are sequentially connected, and accordingly the chamber wall 34 is also installed between the unwinding chamber and the deposition chamber and between the deposition chamber and the winding chamber, respectively.

By this allocation, the opposing area of the electrode and the substrate in the deposition chamber can be maximized. In addition, the tensile strength effecting the substrate in a continuous polymerization is reduced to thus smoothly performing the polymerization. It is made easy to install an additional apparatus at the winding chamber because the unwinding chamber and the winding chamber are separated from each other. Further, it is made possible to control the deposition chamber and the winding chamber in a different way, for thereby maximizing the productivity of the substrate to be polymerized.

In an example of applying a power to the substrate, even though the band-type substrate is cut during polymerization, or the substrate is separated from the roll by applying a power to the unwinding roll in the unwinding chamber, the power is automatically turned off in the deposition chamber and winding chamber for thereby preventing an, electric shock from being applied to the apparatus.

Figure 4:
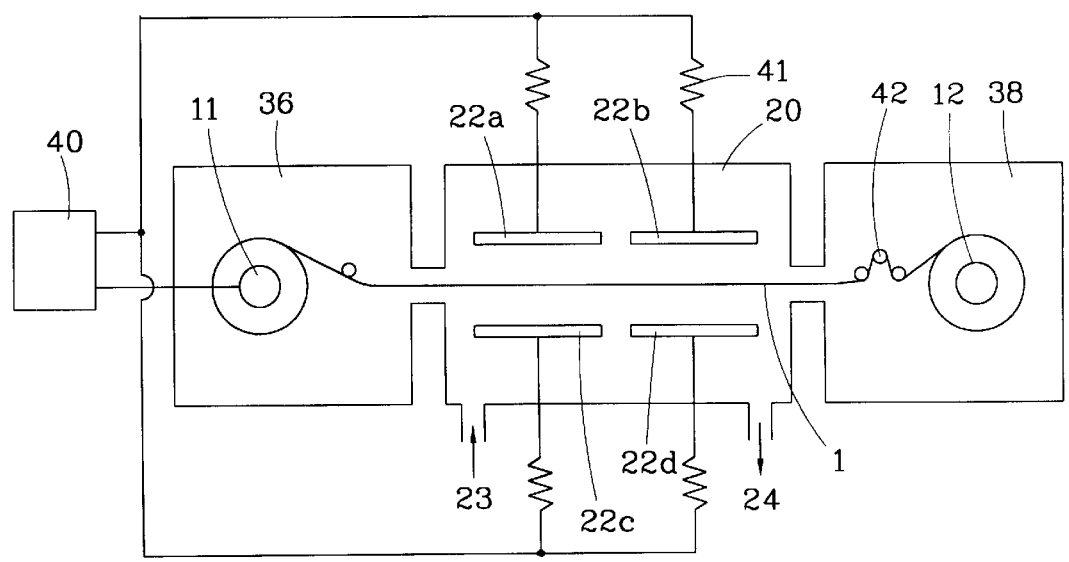
FIG. 4 is a cross-sectional schematic view showing an apparatus for forming polymer continuously by DC plasma polymerization according to another embodiment of the present invention, wherein two electrodes are installed to both surfaces of a substrate in the apparatus as shown in FIG. 3.

FIG. 4 is a cross-sectional schematic view showing an apparatus according to another embodiment of the present invention, wherein electrodes 22a, 22b, 22c, and 22d are installed to both the surfaces of the substrate in the apparatus as shown in FIG. 3. In this electrode structure, it is prevented that the electrodes are contaminated due to carbonization occurred mainly on the circumferential portions of the electrode, and accordingly deposition is non-uniformly formed to thus lower the uniformity of the product. The carbonization occurs uniformly in a discharge area for thereby improving the reliability of the product. Unlike the embodiment as shown in FIG. 4, it is also possible to install a plurality of electrodes. In addition, the above electrode structure can be applied to the apparatus as shown in FIG. 2.

In the embodiment as in FIG. 4, it is shown that a resistance 41 is attached to each of the electrodes. Such a resistance makes it possible to stably generate plasma by preventing variation in current and voltage by each electrode.

Figure 5A:
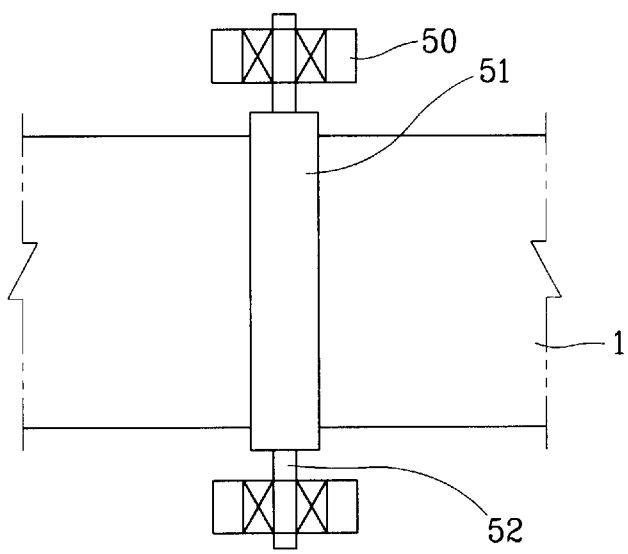
FIG. 5A is a plane view showing a substrate contacting to an idle roller in a transport chamber.
Figure 5B:
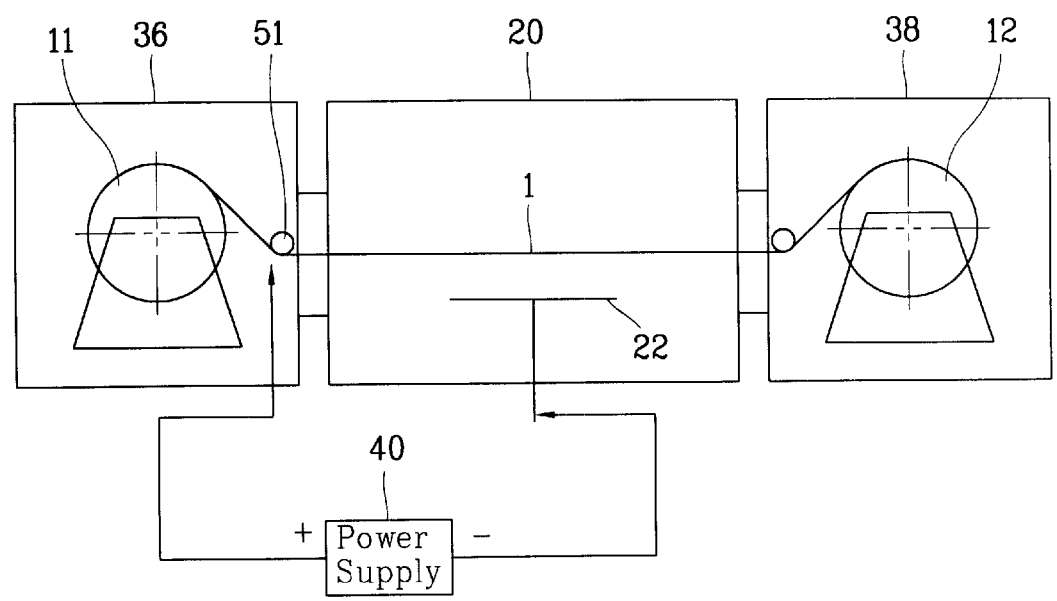
FIG. 5B is a schematic view-showing a method for applying a power to the idler roller in the transport chamber.

As another method for applying a power to the substrate, the idle roller can be powered on. The idle roller is positioned next to the unwinding roll of the transport chamber, maintains the feed track of the substrate constant in contact with the substrate to be transported, and gives the substrate a tensile strength so that the substrate is not sagged. FIG. 5A is a plane view showing a substrate 1 contacting to an idle roller 51 in a transport chamber, and FIG. 5B is a schematic view showing a method for applying a power to the idler roller in the transport chamber.

Figure 5C:
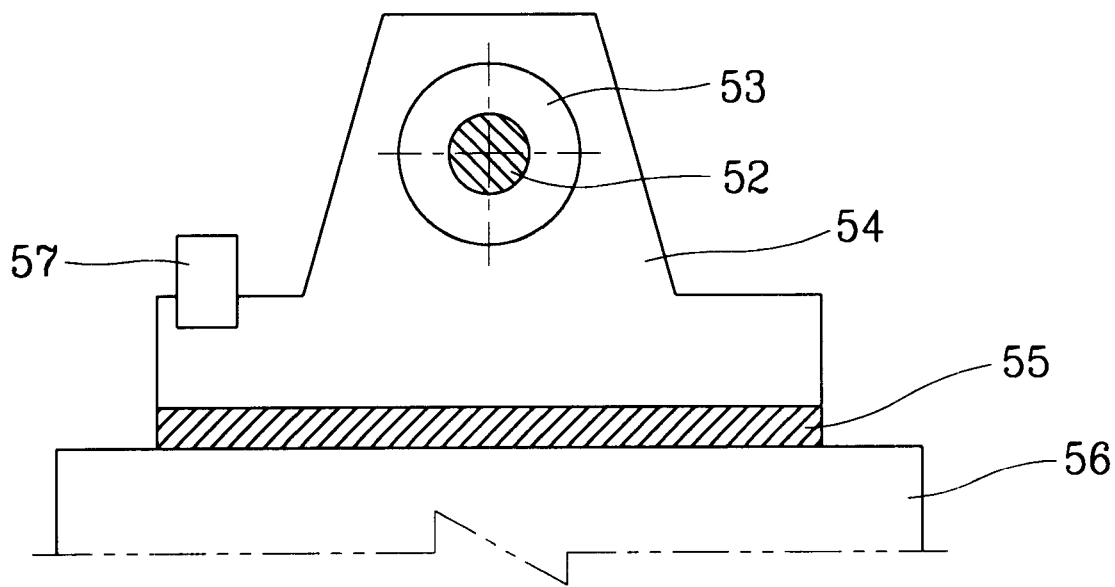
FIG. 5C is a cross-sectional view of shaft supporting unit for supporting the idler roller.

The idle roller 51 is supported by a shaft supporting unit. FIG. 5C illustrates a cross-sectional view of the shaft supporting unit. The shaft supporting unit comprises: a bearing 53 into which a shaft 52 of the idle roller is inserted to thus be rotatable; a block 54 at which the bearing is installed; a connector 57 installed at one end of the block to thus be connected with the power supply of a high voltage supply unit; a supporter 56 for supporting the block from a lower portion and making a load on the idle roller to be transmitted to the bottom of the chamber; and an insulating member 55 inserted between the block and the supporter for thereby electrically insulating them. The shaft supporting unit serves to transmit the load of the substrate applied on the idle roller to the bottom of the transport chamber. The idler roller 51 is powered oh by connecting a power supply to the connector 57 of the block, and as the result the substrate 1 contacting to the idle roller acts as an electrode. Therefore, each of the components of the shaft supporting unit excepting the insulating member and the idler roller has to be made of metal.

Figure 6:
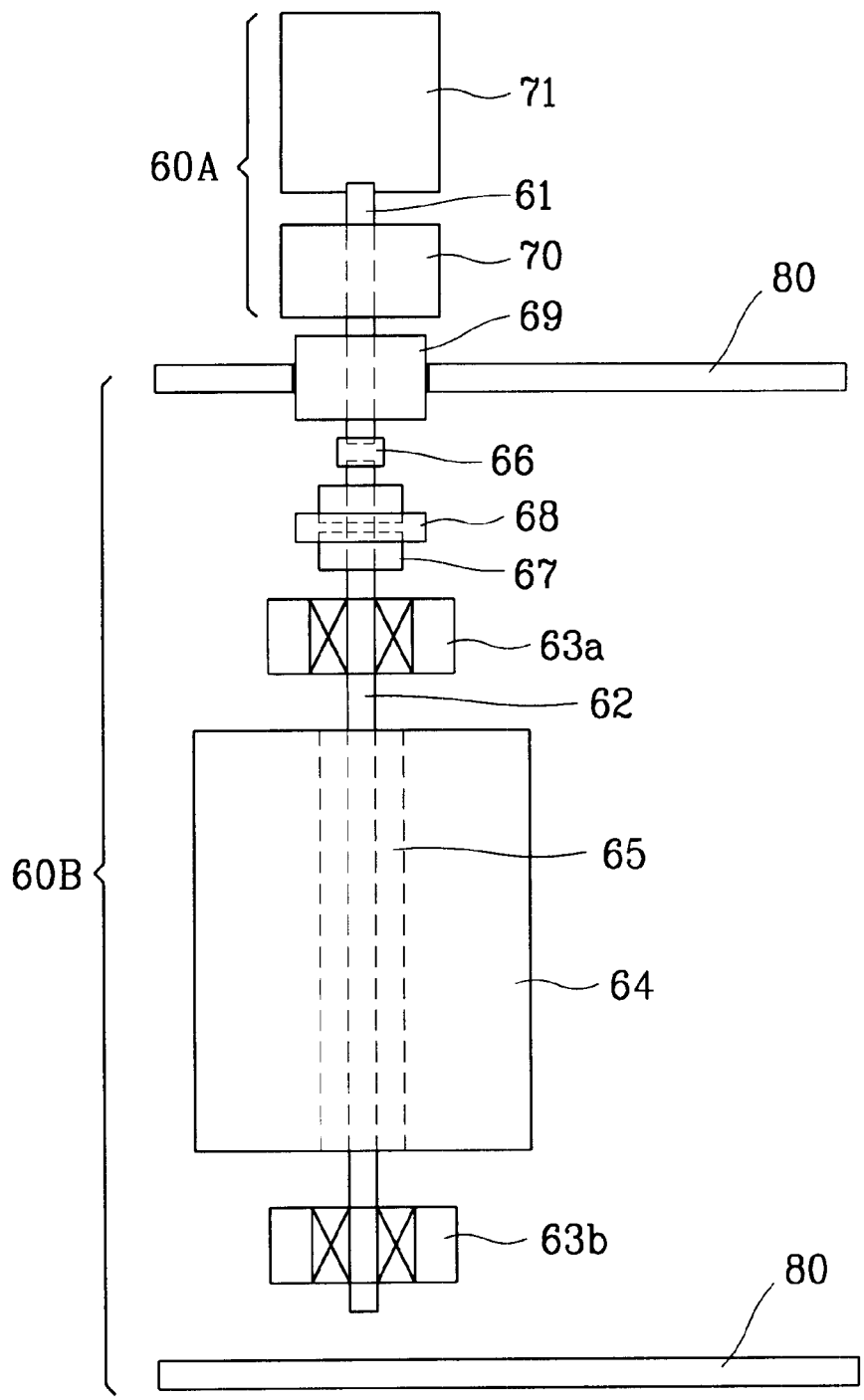
FIG. 6 is a plane view showing a unwinding roll (or winding roll) in the transport chamber.

When a power is applied to a substrate, the unwinding roll or winding roll has to be insulated. One example of an insulating method is illustrated in FIG. 6.

The transport chamber comprises: a driving unit 60A for supplying rotating force from the outside of the transport chamber to an unwinding roll 60B; a first driving shaft 61 directly connected to the driving unit for transmitting the rotating force of the driving unit; a second driving shaft 62 connected to a roll 64 to which a substrate is wound and the first driving shaft; shaft supporting units 63a, 63b for supporting the second driving shaft and transmitting a load of the substrate on the second driving shaft to the transport chamber; and an insulating coupling 66 inserted between the first driving shaft and the second driving shaft for thereby insulating the two driving shafts. The second driving shaft 62 at the opposite side of the driving unit 60A is spaced apart from the chamber wall 80. The driving unit 60A can further comprises a motor 71 and a decelerator 70. Reference numerals 67, 68, and 69 designates a spline, rotary feedthrough, and a chain, respectively.

The shaft supporting unit can have the same structure as shown in FIG. 5C, which includes a bearing 53 into which the end of the second driving shaft 62 is inserted to thus be rotatable; a block 54 at which the bearing is installed; a connector 57 installed at one end of the block to thus be connected with the power supply of a high voltage supply unit; a supporter 56 for supporting the block from a lower portion and making a load on the second driving shaft to be transmitted to the bottom of the chamber; and an insulating member 55 inserted between the block and the supporter for thereby electrically insulating them.

Accordingly, one end of the unwinding roll 60B is spaced apart, the other end thereof is connected to the driving unit 60A by an insulating coupling, and the insulating member 55 is inserted into the shaft supporting units 63a and 63b thereby entirely insulating the unwinding roll 60B from the chamber. Here, this insulating method is explained with respect to the unwinding roll, and it is also applied to the winding roll in the same way.

Meanwhile, in the case that the unwinding roll or winding roll is powered on, a power is applied to the block at which the bearing of the shaft supporting unit is installed, and the unwinding roll or winding roll is insulated from the chamber in the same manner as the above-described method.

According to the present invention, it is possible to deposit a high quality film by making discharge occurred only in an opposite electrode portion without closing the gap between chambers by a differential opening and the like, and both surfaces of the substrate is plasma polymerized at a time under the same conditions, thereby improving the productivity of the product. In addition, it is possible to deposit a film uniformly on the substrate by installing a plurality of electrodes and accordingly making carbonization on the electrodes to be uniformly occurred in a discharge area. In addition, the effect of polymerization can be enhanced by using the substrate as an electrode, preferably, an anode, and a variety of methods for applying a power to the substrate can be selected according to the processing conditions. Accordingly, the present invention provides an apparatus for forming polymer by DC plasma polymerization capable of obtaining a good quality plasma polymerized film in a more effective way.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. An apparatus for forming polymer continuously by DC plasma polymerization comprising:

a transport chamber having an unwinding roll for unwinding a substrate to be surface treated and transporting the same to another chamber and a winding roll for winding the surface-treated substrate;

a deposition chamber for plasma polymerizing the surface of the substrate by DC discharge plasma by using the substrate as an electrode and by installing at least one opposite electrode opposed to the substrate;

a high voltage supply unit electrically connected to the substrate for applying a high voltage to the substrate;

an insulating unit for electrically insulating an electrical path between the high voltage supply unit and the substrate from the main body of the apparatus;

a pumping unit for maintaining the deposition chamber vacuous; and a gas supply unit for introducing reactive gas and unreactive gas into the deposition chamber;

wherein, in order to apply a power to the substrate via the unwinding roll and insulate the electric path from the main body of the apparatus, the transport chamber comprises: a driving unit for supplying rotating force from the outside of the transport chamber to the unwinding roll, a first driving shaft directly connected to the driving unit for transmitting the rotating force of the driving unit; a second driving shaft connected to a roll to which a substrate is wound and the first driving shaft, shaft supporting units for supporting the second driving shaft and transmitting a load of the substrate on the second driving shaft to the transport chamber; and an insulating coupling inserted between the first driving shaft and the second driving shaft for thereby insulating the two driving shafts; and the shaft supporting unit comprises: a bearing into which the end of the second driving shaft is inserted to thus be rotatable; a block at which the bearing is installed; a connector installed at one end of the block to thus be connected with the power supply of a high voltage supply unit; a supporter for supporting the block from a lower portion and making a load on the second driving shaft to be transmitted to the bottom of the chamber; and an insulating member inserted between the block and the supporter for thereby electrically insulating them.

2. An apparatus for forming polymer continuously by DC plasma polymerization comprising:

a transport chamber having an unwinding roll for unwinding a substrate to be surface-treated and transporting the same to another chamber and a winding roll for winding the surface-treated substrate;

a deposition chamber for plasma polymerizing the surface of the substrate by DC discharge plasma by using the substrate as an electrode and by installing at least one opposite electrode opposed to the substrate;

a high voltage supply unit electrically connected to the substrate for applying a high voltage to the substrate;

an insulating unit for electrically insulating an electrical path between the high voltage supply unit and the substrate from the main body of the apparatus wherein the insulating unit is positioned at a portion at which the unwinding roll is supported in the transport chamber and further comprises an insulating member for insulating the unwinding roll from the transport chamber;

a pumping unit for maintaining the deposition chamber vacuous; and a gas supply unit for introducing reactive gas into the deposition chamber, wherein, in order to apply a power to the substrate via the unwinding roll and insulate the electric path from the main body of the apparatus, the transport chamber comprises a driving unit for supplying rotating force from the outside of the transport chamber to the unwinding roll; a first driving shaft directly connected to the driving unit for transmitting the rotating force of the driving unit; a second driving shaft connected to a roll to which a substrate is wound and the first driving shaft; shaft supporting units for supporting the second driving shaft and transmitting a load of the substrate on the second driving shaft to the transport chamber; and an insulating coupling inserted between the first driving shaft and the second driving shaft for thereby insulating the two driving shafts; and the shaft supporting unit comprises: a bearing onto which the end of the second driving shaft is inserted to thus be rotatable; a block at which the bearing is installed; a connector installed at one end of the block to thus be connected with the power supply of a high voltage supply unity; a supported for supporting the block from a lower portion and making a load on the second driving shaft to be transmitted to the bottom of the chamber; and an insulating member inserted between the block and the supporter for thereby electrically insulating them.

3. An apparatus for forming polymer continuously by DC plasma polymerization comprising:

a transport chamber having an unwinding roll for unwinding a substrate to be surface-treated and transporting the same to another chamber and a winding roll for winding the surface-treated substrate;

a deposition chamber for plasma polymerizing the surface of the substrate by DC discharge plasma by using the substrate as an electrode and by installing at least one opposite electrode and by installing at least one opposite electrode opposed to the substrate;

a high voltage supply unit electrically connected to the substrate for applying a high voltage to the substrate;

an insulating unit for electrically insulating an electrical path between the high voltage supply unit and the substrate from the main body of the apparatus;

a pumping unit for maintaining the deposition chamber vacuous; and a gas supply unit for introducing reactive gas and unreactive gas into the deposition chamber, wherein, in order to apply a power to the substrate via the winding roll and insulate the electric path from the main body of the apparatus, the transport chamber comprises: a driving unit for supplying rotating force from the outside of the transport chamber to the unwinding roll; a first driving shaft directly connected to the driving unit for transmitting the rotating force of the driving unit; a second driving shaft connected to a roll to which a substrate is wound and the first driving shaft by engagement; shaft supporting units for supporting the second driving shaft and transmitting a load of the substrate on the second driving shaft to the transport chamber; and an insulating coupling inserted between the first driving shaft and the second driving shaft for thereby insulating the two driving shafts; and said shaft supporting unit comprises: a bearing into which the end of the second driving shaft is inserted to thus be rotatable; a block at which the bearing is installed; a connector installed at one end of the block to thus be connected with the power supply of a high voltage supply unit; a supporter for supporting the block from a lower portion and making a load on the second driving shaft to be transmitted to the bottom of the chamber; and an insulating member inserted between the block and the supporter for thereby electrically insulating them.

4. An apparatus for forming polymer continuously by DC plasma polymerization comprising:

a transport chamber having an unwinding roll for unwinding a substrate to be surface-treated and transporting the same to another chamber and a winding roll for winding the surface-treated substrate;

a deposition chamber for plasma polymerizing the surface of the substrate by DC discharge plasma by using the substrate as an electrode and by installing at least one opposite electrode opposed to the substrate;

a high voltage supply unit electrically connected to the substrate for applying a high voltage to the substrate;

an insulating unit for electrically insulating an electrical path between the high voltage supply unit and the substrate from the main body of the apparatus, wherein the insulating means is positioned at a portion which the winding roll is supported in the transport chamber and further comprises an insulating member for insulating the winding roll from the transport chamber;

a pumping unit for maintaining the deposition chamber vacuous; and a gas supply unit for introducing reactive gas and unreactive gas into the deposition chamber, wherein, in order to apply a power to the substrate via the winding roll and insulate the electric path from the main body of the apparatus, the transport chamber comprises: a driving unit for supplying rotating force from the outside of the transport chamber to the unwinding roll; a first driving shaft directly connected to the driving unit for transmitting the rotating force of the driving unit; a second driving shaft connected to a roll to which a substrate is wound and the first driving shaft by engagement; shaft supporting units for supporting the second driving shaft and transmitting a load of the substrate on the second driving shaft to the transport chamber; and an insulating coupling inserted between the first driving shaft and the second driving shaft for thereby insulating the two driving shafts; and said shaft supporting unit comprises: a beating into which the end of the second driving shaft is inserted to thus be rotatable; a block at which the bearing is installed; a connector installed at one end of the block to thus be connected with the power supply of a high voltage supply unit; a supporter for supporting the block from a lower portion and making a loan on the second driving shaft to be transmitted to the bottom of the chamber; and an insulating member inserted between the block and the supported for thereby electrically insulating them.

* * * * *